(12) United States Patent
Punsalan et al.

(10) Patent No.: US 7,695,998 B2
(45) Date of Patent: Apr. 13, 2010

(54) METHODS FOR MAKING AND USING HIGH-MOBILITY INORGANIC SEMICONDUCTIVE FILMS

(75) Inventors: David Punsalan, Eugene, OR (US); John Thompson, Albany, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 497 days.

(21) Appl. No.: 11/173,521

(22) Filed: Jul. 2, 2005

(65) Prior Publication Data

US 2007/0003877 A1 Jan. 4, 2007

(51) Int. Cl.
*H01L 51/40* (2006.01)

(52) U.S. Cl. .......................... 438/99; 438/82

(58) Field of Classification Search .............. 257/40; 438/99

See application file for complete search history.

(56) References Cited

U.S. PATENT DOCUMENTS

| | | | |
|---|---|---|---|
| 5,271,797 A * | 12/1993 | Kamisawa | 216/87 |
| 5,630,872 A | 5/1997 | Ogi et al. | |
| 5,942,376 A * | 8/1999 | Uchida et al. | 430/330 |
| 6,164,850 A | 12/2000 | Speakman | |
| 6,387,012 B1 | 5/2002 | Mitamura | |
| 6,402,403 B1 | 6/2002 | Speakman | |
| 6,503,831 B2 | 1/2003 | Speakman | |
| 6,517,901 B1 * | 2/2003 | Minami et al. | 427/226 |
| 6,713,389 B2 | 3/2004 | Speakman | |
| 6,788,376 B2 | 9/2004 | Izumi et al. | |
| 6,864,936 B2 | 3/2005 | Izumi et al. | |
| 6,899,840 B2 | 5/2005 | Ueda et al. | |
| 2002/0053320 A1 | 5/2002 | Duthaler et al. | |
| 2002/0083863 A1 | 7/2002 | Mitamura | |
| 2006/0166537 A1 | 7/2006 | Thompson et al. | |

FOREIGN PATENT DOCUMENTS

| | | |
|---|---|---|
| EP | 1324398 | 7/2003 |
| GB | 2330451 A | 4/1999 |
| GB | 2369087 A | 5/2002 |
| WO | WO2004/094328 | 11/2004 |

OTHER PUBLICATIONS

J. Yu et al."Structural and electrical characteristics of zirconium oxide layers derived by photo-assisted sol-gel processing," Appl. Phys. A., 74, (2002) 143-146.
A. Mills et al."An overview of semiconductor photocatalysis," J. Photochem. & Photobiol. A, Chem, 108, (1997) pp. 1-35.
N. Tohge et al.,"Effects of UV Radiation on the Formation of Oxide Thin Films from Chemically Modified Metal-Alkoxides," J. Sol-Gel Sci. & Techn., 2 (1994) 581-585.
Ohyama et al., Sol-gel preparation of ZnO films with extremely preferred orientation along (002) plane from zinc acetate solution, Thin Solid Films, Aug. 1997, pp. 78-85.
Notification of Transmittal of the International Search Report and the Written Opinion of the International Searching Authority dated Jan. 31, 2007.

* cited by examiner

*Primary Examiner*—Eugene Lee
*Assistant Examiner*—Anthony Ho

(57) ABSTRACT

Inorganic semiconductive films are made by depositing a suitable precursor substance upon a substrate, irradiating the precursor substance with electromagnetic radiation to form a nascent film, and heating the nascent film at a predetermined temperature to form an inorganic semiconductive film.

42 Claims, 5 Drawing Sheets

METHODS FOR MAKING AND USING HIGH-MOBILITY INORGANIC SEMICONDUCTIVE FILMS

TECHNICAL FIELD

This invention relates generally to inorganic semiconductive films and methods for making and using such films.

BACKGROUND

Electronic devices such as field-effect transistors (FET's) are conventionally formed on a substrate, such as a silicon semiconductor substrate or an insulating substrate, and are combined with interconnections to form integrated circuits, which may be used, for example, as an array of transistors to address pixel elements in displays. The integrated assemblies have typically been built up by forming a number of layers, each layer being formed by depositing a film of semiconductor, insulator or electrical conductor material and by subsequently patterning the film of deposited material, typically by photolithography in a subtractive process (i.e., a portion of a blanket-deposited film is selectively removed). Conventionally, fabrication of semiconductor devices uses a number of different processes performed sequentially, and such sequential methods can increase the time, and therefore the cost, of device fabrication.

Inorganic semiconductive films have been formed by many known methods, including deposition by evaporation, chemical vapor deposition, physical vapor deposition (i.e., sputtering), etc., and subsequent patterning by photolithography.

Inkjet printing methods have been used for many purposes, including ordinary printing of ink on paper, formation of 3-dimensional objects, deposition of photopolymerizable solutions for photolithographic patterning, printing of color filters for liquid-crystal displays, printing of light-emitting layers for electroluminescent devices, printing of conductive traces on circuit boards and integrated circuits, and many other purposes.

Organic semiconductor films have been inkjet printed, and these materials are suitable for some applications, but they have not provided carrier mobilities (i.e., for current drive capability) achievable with inorganic semiconductor films. Another well-known disadvantage of organic semiconductors is that the performance (e.g., on-to-off current ratio) strongly declines over a relatively short period of time, which precludes their use for long-term-use products (e.g., two years or more of use).

Inorganic thin-film semiconductors of polycrystalline silicon and amorphous silicon have many attractive qualities, including lifetime and performance qualities, but patterned films of polycrystalline silicon or amorphous silicon have not been prepared successfully by any additive process.

Thus, there is a need for efficient and economical methods for forming patterned inorganic semiconductive films.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Throughout this specification and the appended claims, the term "liquid" is meant to include colloidal solutions (sols) and gels, such as hydrogels and sol-gels; the term "printing" is meant to exclude patterning by photolithography; and the term "printing" is also meant to exclude subtractive patterning processes.

According to a general aspect of embodiments of the invention, inorganic semiconducting films are made by providing a substrate, depositing a suitable precursor substance upon the substrate, irradiating the precursor substance with electromagnetic radiation to form a nascent film, and heating the nascent film at a predetermined temperature to form an inorganic semiconducting film. Some embodiments of inorganic semiconducting films made in accordance with the present invention comprise semiconducting oxide films.

Thus, a specific aspect of embodiments of the invention is a method for making a semiconducting oxide film. Embodiments of this method comprise steps of providing a substrate, depositing upon the substrate a suitable precursor substance comprising a liquid comprising at least one metal, irradiating the precursor substance with electromagnetic radiation to form a nascent film, and heating the nascent film at a predetermined temperature to form an inorganic semiconducting film, such as a semiconducting oxide film.

Figure 1:
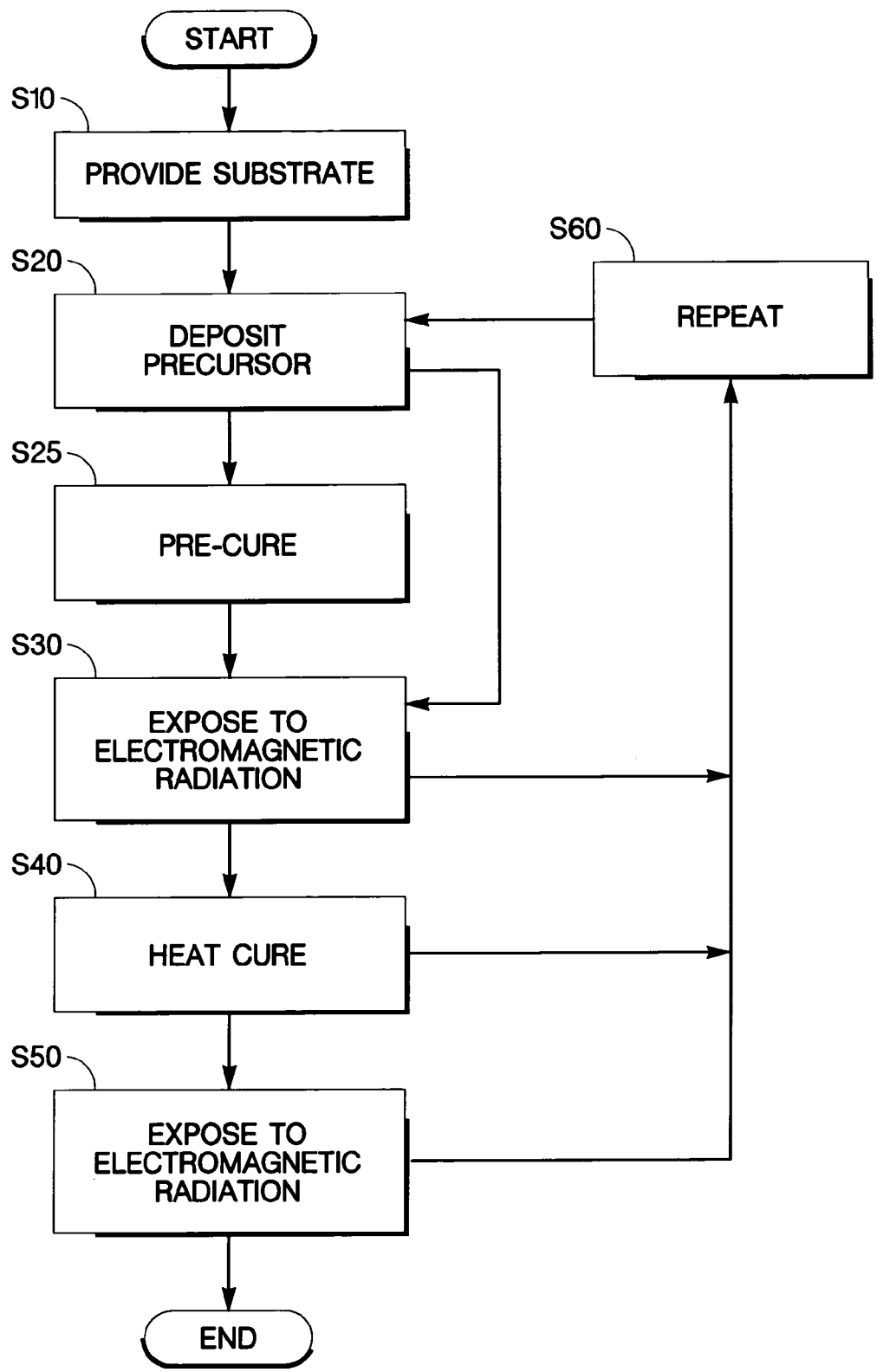
FIG. 1 is a flowchart illustrating an embodiment of a method performed in accordance with the invention.

FIG. 1 is a flowchart illustrating an embodiment of a method performed in accordance with the invention. Steps are denoted by reference numerals S10, . . . , S60. Various alternate paths through the flowchart are indicated by the arrows. In step S10, a substrate suitable for forming semiconductor devices is provided. For example, the substrate may be a glass, a ceramic, aluminum oxide, or an insulating layer such as silicon oxide or nitride on another base substrate such as a silicon wafer. Alternatively, the substrate may be an appropriate flexible material such as a polymer (e.g., polyimide), stainless steel foil with a passivated surface, or ultra-thin glass.

In step S20, the precursor substance is deposited onto the substrate. In some embodiments of such methods, the step of depositing a suitable precursor substance includes patterning the precursor substance. In some such embodiments, the precursor substance is simultaneously deposited and patterned by printing the precursor substance, e.g., by inkjet printing the precursor substance. Other additive techniques that may be used include gravure (e.g., intaglio or photogravure) printing, offset printing, microstamping, dip-pen printing, and their combinations with each other or with inkjet printing. Various advantages accrue from the simultaneous deposition and patterning of the precursor provided by inkjet printing. Notable among these advantages are fewer process steps, elimination of masks and masking steps, conservation of costly precursors, and faster processing compared with conventional processing. As will be described in more detail below, some aspects of the invention also advantageously provide lower temperature processing.

A suitable precursor substance may be essentially any substance that includes a material (including at least one metal) convertible by embodiments of the present method to an inorganic semiconductive film. The precursor substance may comprise a colloidal solution (sol) or gel, such as a hydrogel or sol-gel, and may comprise an oligomeric hydrocarbon. The metal included in the precursor substance may be in any one of a number of chemical forms convertible to an inorganic semiconductor. For some embodiments, the precursor substance may comprise an alkoxide of a transition metal and/or of a main group metal. The precursor substance may comprise a phosphor material. Specifically, the precursor substance may be a precursor for at least one of the oxides selected from the list consisting of zinc oxide, tin oxide, zinc tin oxide, titanium oxide, palladium oxide, indium oxide, gallium oxide, cadmium oxide, and combinations of these oxides. Precursors for all of these oxides are known.

The precursor is prepared with suitable conventional solvents and various conventional additives to allow printability and chemical stability. These additives control the dynamic viscosity and solids percentage content, for example, of the precursor inkjet "ink."

In step S30, the precursor is exposed to electromagnetic radiation. Irradiation of the precursor substance may be performed by irradiating with electromagnetic radiation at a dose in the range from about 0.1 Joule/cm$^2$ to about 100 Joules/cm$^2$, with radiation having an effective wavelength of less than about 350 nanometers, e.g., at least one of ultraviolet light, an electron beam, an ion beam, X-radiation, gamma radiation, and combinations of these radiations. For example, the irradiation may comprise irradiating the precursor with ultraviolet light having at least one wavelength between about 157 nanometers and about 350 nanometers. Any of these radiations modify the precursor in various ways (discussed below), and thus form a nascent film. The irradiation may be done while the precursor substance is wet, i.e., still laden with solvent. Additionally, as described below, the irradiation may be performed while simultaneously heating the film at a temperature between ambient temperature and the final annealing temperature.

In step S40, the precursor is treated by heating to a suitable temperature to remove any remaining solvent and to form the semiconducting film. Heating of the precursor may be done by heating at a predetermined temperature below about 550° C., e.g., between about 350° C. and about 550° C. Those skilled in the art will recognize that the predetermined temperature and heating time are chosen to be suitable for removing the solvent used and to form the semiconducting film from the particular precursor used. Temperatures lower than about 350° C. may be useful for some precursors, as long as the resulting performance is acceptable for the intended application.

Optionally, the method may be modified by performing a pre-curing step S25 at a temperature below this predetermined temperature. Pre-curing step S25 may be performed before heating the nascent film at the predetermined temperature in step S40. Pre-curing step S25 may include exposing the precursor substance to electromagnetic radiation, which may be one of the short-effective-wavelength radiations mentioned above, or may be, for example, infrared radiation, which includes much longer wavelengths than those listed above. In many embodiments, the precursor substance includes a quantity of solvent. Pre-curing step S25 may then comprise heating the nascent film at a suitable temperature to remove at least a portion of the solvent, before heating the nascent film at the predetermined temperature. Heating may be combined with step S30 of exposing to electromagnetic radiation. Thus, steps S25 and S30 may be performed simultaneously in some embodiments of the method. Similarly, steps S30 and S40 may be performed simultaneously for some embodiments of the method. The heating in such combined steps may be performed, for example, by exposure to infrared radiation.

Optionally, another irradiation step S50 (similar to step S30) may be performed after heat-curing step S40.

The combination of these steps produces a layer of inorganic semiconductor, e.g., a semiconducting oxide film layer. If this layer is not thick enough for the intended application, all or some of the steps S20-S50 may be repeated (step S60). For example, steps S20-S50 may be repeated a number of times until a desired thickness of inorganic semiconductive film is reached. Or, for another example, steps S20-S30 may be repeated a number of times until a first predetermined thickness is reached before performing step S40 to form a desired second predetermined thickness of inorganic semiconductive film.

Thus, another aspect of the invention is an embodiment of an inorganic semiconductive layer made by depositing a precursor substance, irradiating the precursor substance with radiation having an effective wavelength of less than about 350 nanometers, and thermally treating the resultant material. Various such inorganic semiconductive layers may be made using at least one of the radiations: ultraviolet light, an electron beam, an ion beam, X-radiation, gamma radiation, and their combinations.

A related aspect of the invention is an embodiment of a patterned inorganic semiconductive layer made by inkjet printing a precursor substance, irradiating the precursor substance with radiation having an effective wavelength of less than about 350 nanometers, and thermally treating the resultant patterned material.

Another aspect of the invention includes embodiments of an inkjet printing method including the acts of providing a substrate, providing a printing medium comprising a precursor substance adapted to be converted to a semiconductive film by irradiation with electromagnetic radiation and by heating, inkjet printing the printing medium in a desired pattern on the substrate to form a patterned precursor, and converting the patterned precursor to a semiconductive film.

Yet another aspect of the invention provides embodiments of a display comprising a substrate and an inorganic semiconductive layer formed and patterned by printing a pattern of precursor substance on the substrate, irradiating the precursor substance with radiation having an effective wavelength of less than about 350 nanometers, and thermally treating the resultant patterned material. In making embodiments of such displays, the inorganic semiconductive layer may be formed and patterned by inkjet printing the pattern of precursor substance.

Another aspect of the invention is a method of using an inkjet printing system for forming a patterned inorganic semiconductive film on a substrate. This method comprises providing a suitable precursor substance comprising a liquid including at least one metal, depositing the precursor substance in a desired pattern on the substrate by inkjet printing, irradiating the precursor substance with electromagnetic radiation to form a nascent film, and heating the nascent film at a predetermined temperature to form a patterned inorganic semiconductive film. Of course, the inkjet system includes conventional components such as an inkjet head, etc. and includes the means for controlling deposition of the precursor substance with the inkjet head. As in other methods described above, a desired thickness of inorganic semiconductive film may be built up by repeating all these steps except providing a substrate, or by repeating the corresponding steps that precede the final heating a number of times until a first predetermined thickness is reached before performing the heating step to form the desired second predetermined thickness of film.

As mentioned above, one effect on the precursor substance due to heating and/or irradiation with electromagnetic radiation is the removal of solvent from the precursor substance. At least some of the embodiments described herein are also believed to benefit from the effect of the electromagnetic radiation, e.g., ultraviolet light, assisting in the decomposition of oligomeric organic species (e.g., organic alkoxide ligands or stabilizers). Also, it is believed that photocatalytic activity of metal oxide can create electron-hole pairs that can form free radicals which are highly efficient in promoting oxidation of organic matter. Reactions leading to the full oxidative conversion of oligomeric hydrocarbons to more volatile $CO_2$ or $CO$ gas can aid in the formation of films less contaminated with residual carbon, for example. In a non-exclusive manner, the effect of the electromagnetic radiation may also result in local ordering or densification of the film, or may lead to grain growth for the case of nanocrystalline or polycrystalline materials. However, the invention should not be construed as being limited to the consequences of any particular theory of operation.

EXAMPLES

To illustrate the methods of the invention and inorganic semiconductive film embodiments made by these methods, a specific method was practiced, comprising the steps of providing an insulating substrate, inkjet printing onto this substrate a suitable precursor substance comprising a sol gel containing at least one metal (thus simultaneously depositing and patterning the precursor substance), irradiating the precursor substance with electromagnetic radiation to form a nascent film, and heating the nascent film to form an inorganic semiconductive film embodiment. In these examples, the metals were zinc and tin. The precursor substance was a sol-gel prepared in a conventional manner as described above. The zinc-tin oxide (ZTO) sol-gel precursor contained tin (IV) tert-butoxide, zinc acetate, and monoethanolamine, and the solvent was isopropanol.

Properties of various resultant films were measured, and the results are shown in FIGS. 2-5.

Figure 2:
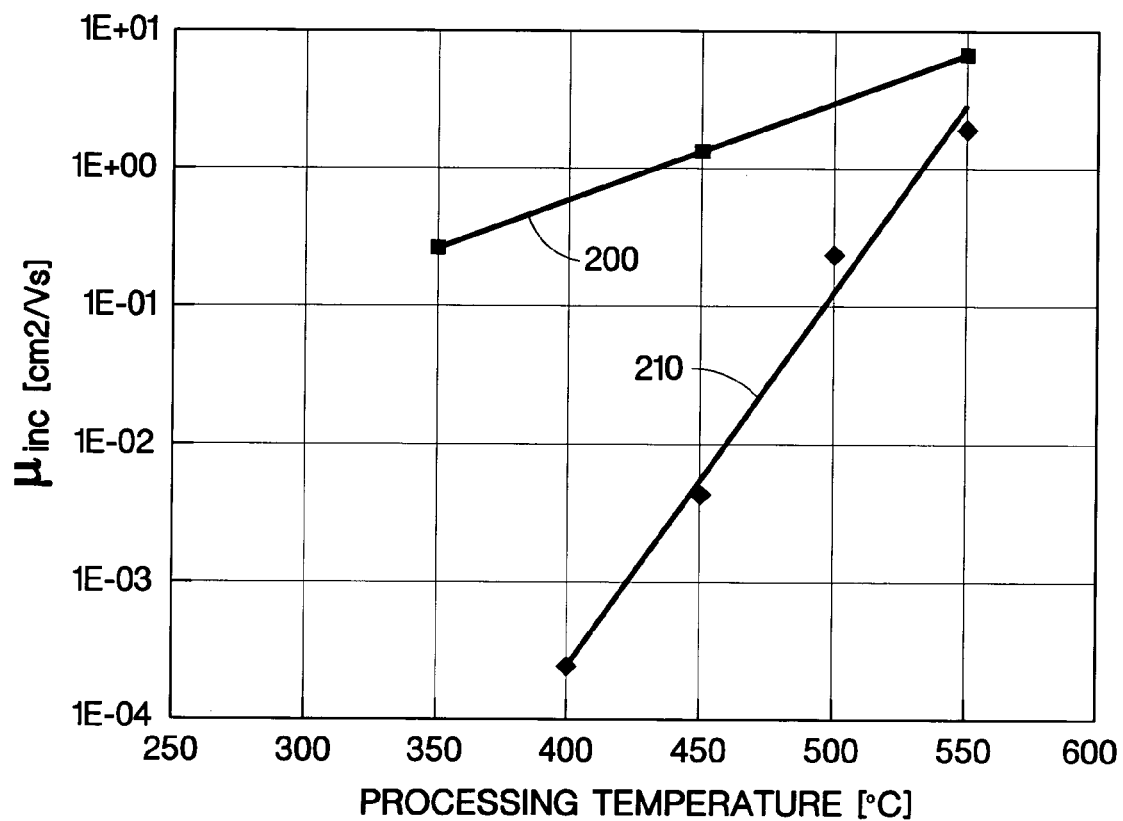
FIG. 2 is a graph illustrating field-effect mobility as a function of processing temperature in various embodiments of devices, including those made in accordance with an embodiment of a method of the invention.

FIG. 2 is a graph illustrating field-effect carrier mobility (vertical axis) as a function of processing temperature (horizontal axis) in various embodiments of test devices made in this general manner, except that the radiation treatment was omitted for some of the devices. For those devices in which the radiation treatment step was included, that treatment consisted of nine minutes of ultraviolet light radiation with wavelengths between about 157 nanometers and about 350 nanometers (an example of step S30 of FIG. 1). As shown in FIG. 2, the processing temperatures used in step S40 of FIG. 1 ranged between 350° C. and 550° C. The top line 200 shows results for devices made using the ultraviolet light treatment; the lower line 210 shows results for devices made by omitting the ultraviolet light treatment. FIG. 2 shows that the field effect carrier mobility was significantly higher, resulting in useful mobility values when the ultraviolet light radiation was used in making the zinc-tin oxide semiconductive film. FIG. 2 also shows that the use of the ultraviolet radiation allowed those films represented by line 200 to achieve a given carrier mobility (e.g., about 5.E-01 $cm^2$/volt-sec) at lower processing temperatures (e.g., about 350° C.) than those films represented by line 210, which required processing at higher temperatures of about 520° C. to reach that same mobility. With processing temperatures of about 400° C., there was an improvement of about 3 orders of magnitude due to the use of ultraviolet radiation in the method of making the semiconducting oxide films. While the improvement due to radiation treatment was generally less at higher processing temperatures, there was nevertheless significant mobility improvement by a factor of about two to three with processing temperatures of about 550° C.

Figure 3A:
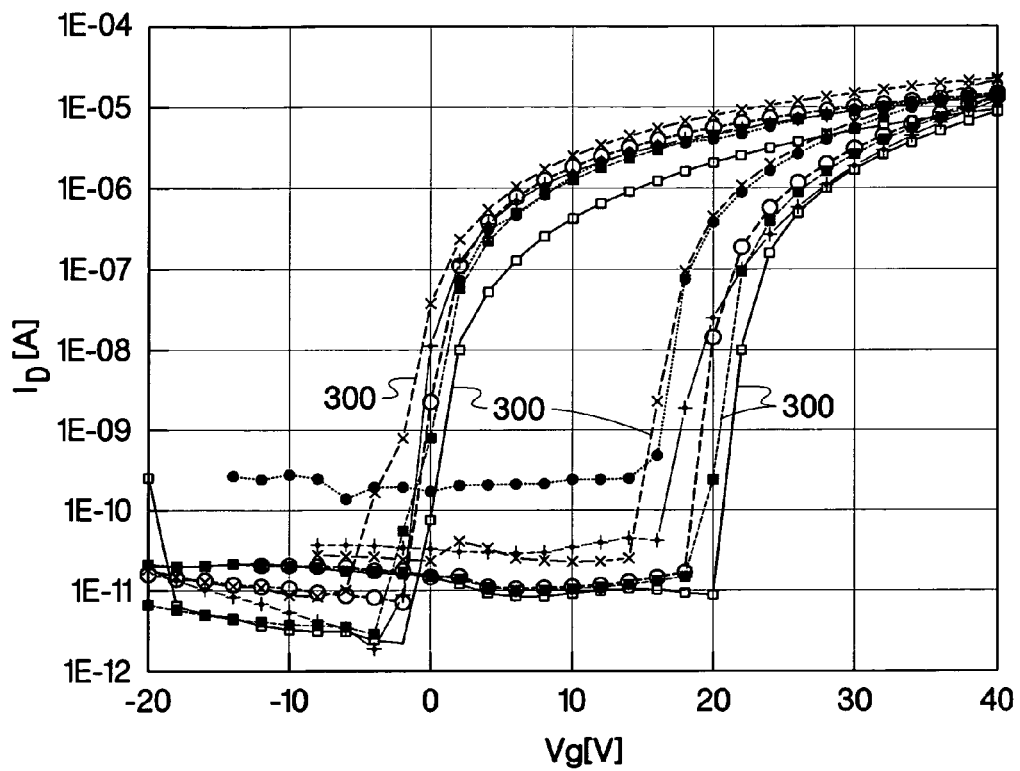
FIGS. 3A, 3B, 4A, and 4B are graphs of drain current vs. gate voltage, illustrating hysteresis in various embodiments of devices, including those made in accordance with an embodiment of a method of the invention.
Figure 3B:
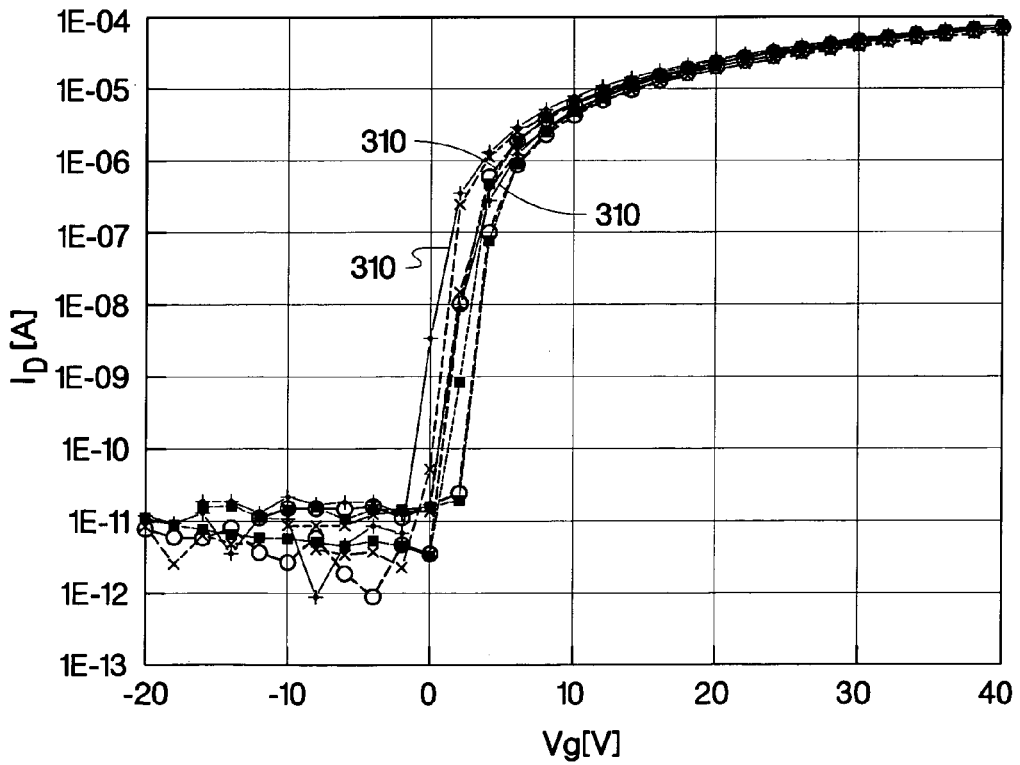

FIGS. 3A and 3B are graphs of drain current vs. gate voltage, illustrating hysteresis in various embodiments of test devices formed while using a 550° C. final furnace anneal (an example of step S40 of FIG. 1). The embodiments graphed in FIG. 3A (curves 300) were made without ultraviolet irradiation. Curves 300 exhibit a significant amount of hysteresis that is readily apparent in FIG. 3A. The embodiments graphed in FIG. 3B (curves 310) were made using nine minutes of high-power ultraviolet light radiation with wavelengths between about 157 nanometers and about 350 nanometers; for those devices, there was very little hysteresis.

Figure 4A:
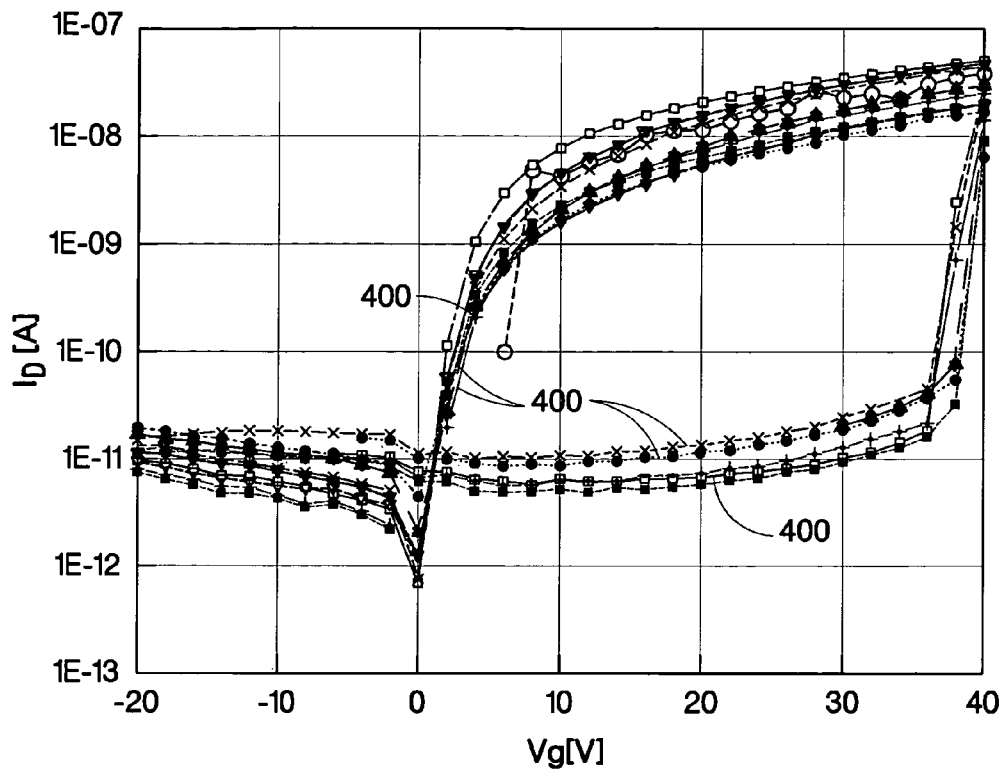
Figure 4B:
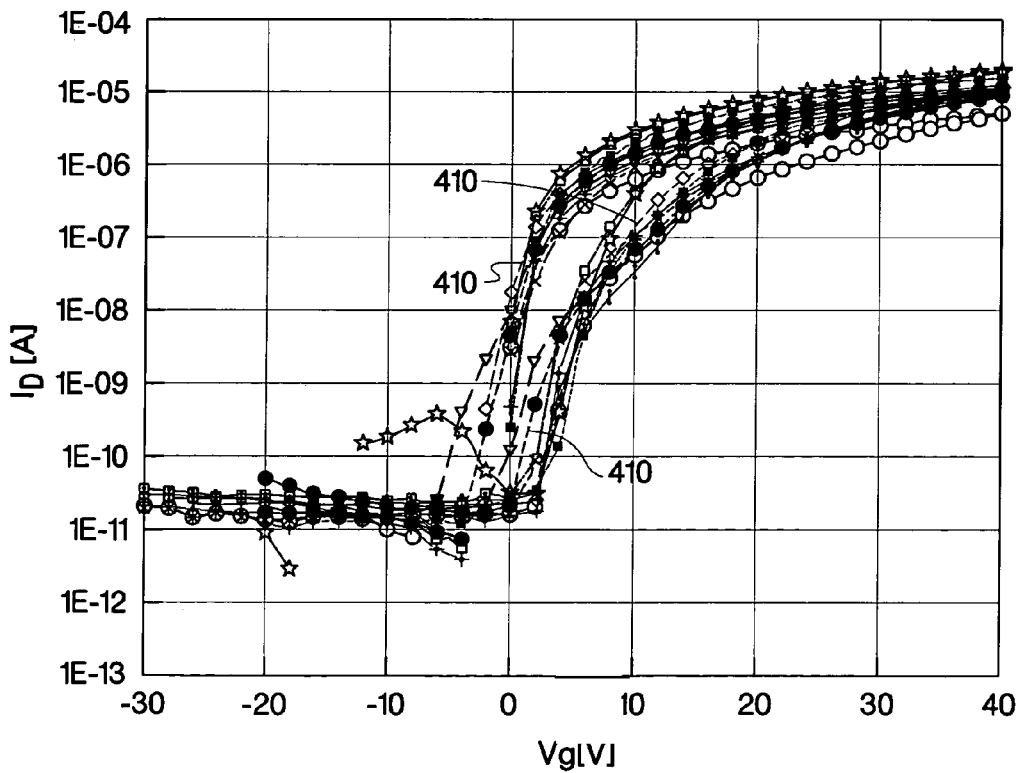

FIGS. 4A and 4B are also graphs of drain current vs. gate voltage, illustrating hysteresis in various embodiments of test devices made using a lower 450° C. final furnace anneal. The embodiments graphed in FIG. 4A (curves 400) were made without ultraviolet irradiation. Curves 400 again exhibit a significant amount of hysteresis that is readily apparent in FIG. 4A. The embodiments graphed in FIG. 4B (curves 410) were made using nine minutes of high-power ultraviolet light radiation, again showing that, while there is some hysteresis shown in the graph of FIG. 4B, it is much reduced in comparison with FIG. 4A. Note that the maximum current drive range shown in FIG. 4B is 1000 times higher than the maximum current drive shown in FIG. 4A.

Figure 5:
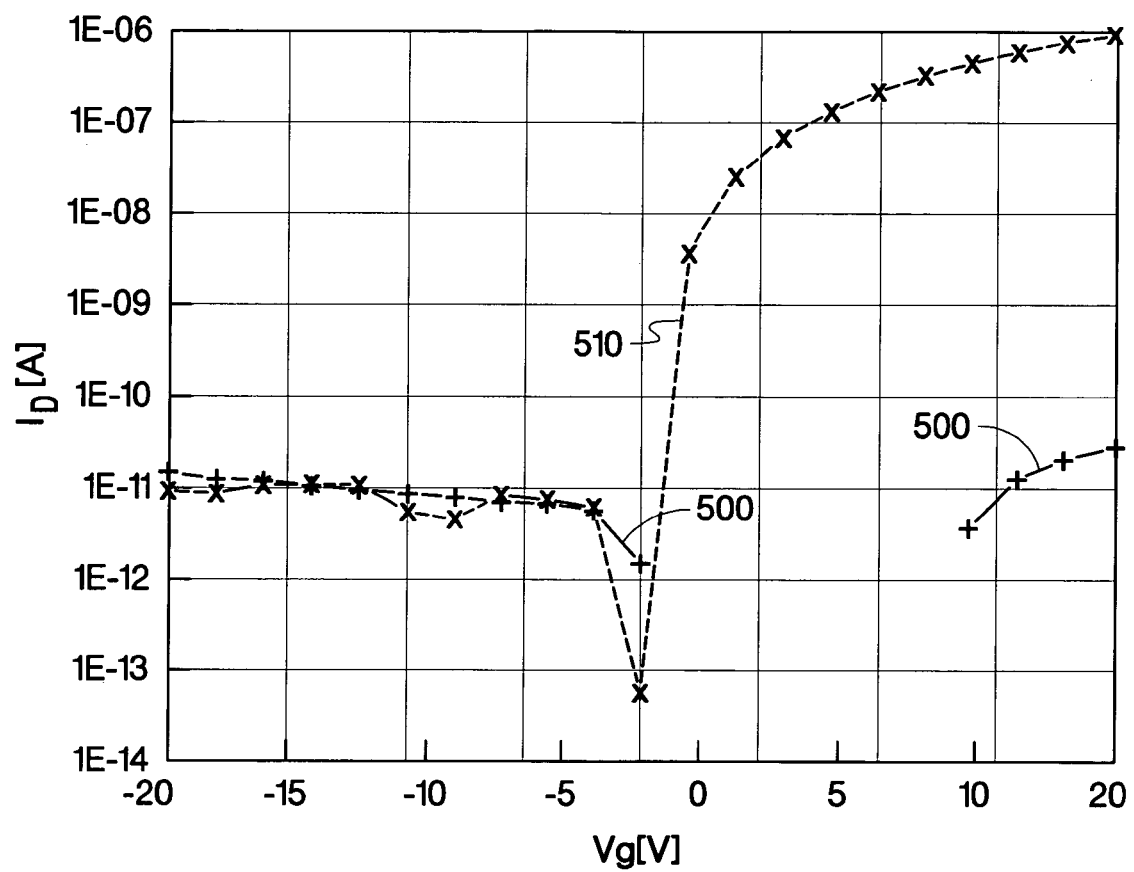
FIG. 5 is a graph of drain current vs. gate voltage, illustrating relative performance of various embodiments of devices, including those made in accordance with an embodiment of a method of the invention.

FIG. 5 is a graph of drain current vs. gate voltage, illustrating relative performance of various embodiments of test devices made using a 350° C. final furnace anneal. Curve 500 from test devices made without ultraviolet radiation treatment of the precursor shows essentially no observable field effect. The curve is discontinuous since the values are plotted on a log scale (for which no negative values may be plotted) and the current signal drifted between positive and negative. Curve 510 from test devices made with nine minutes total of irradiation with high power ultraviolet shows average carrier mobility of about 0.3 $cm^2$/volt-sec, and an on/off ratio of about $10^5$.

INDUSTRIAL APPLICABILITY

Devices made in accordance with the invention are useful in microelectronics and displays. They may also be used in other electronic applications.

Although the foregoing has been a description and illustration of specific embodiments of the invention, various modifications and changes thereto can be made by persons skilled in the art without departing from the scope and spirit of the invention as defined by the following claims. For example, the order of steps may be varied, and functionally equivalent materials may be substituted for specific materials used in the examples. Various additive printing techniques other than the specific techniques mentioned as examples may be used. Inorganic semiconductive films made in accordance with the invention may be further processed (e.g., by subtractive processes) for particular applications.

What is claimed is:

1. A method for making an inorganic semiconducting oxide film, the method comprising the steps of:

a) providing a substrate, b) depositing upon the substrate a precursor substance comprising a liquid including at least one metal,
c) enhancing carrier mobility of the semiconducting oxide film by irradiating the precursor substance with electromagnetic radiation to form a nascent film, and
d) heating the nascent film at a predetermined temperature to form an inorganic semiconducting oxide film,
whereby the combined effects of steps c) of enhancing by irradiating and d) of heating produce enhanced carrier mobility greater than 5.E-01 cm2/Volt-second and greater than carrier mobility obtained without irradiating the precursor substance.

2. The method of claim 1, wherein the step b) of depositing a precursor substance includes patterning the precursor substance.

3. The method of claim 2, wherein the step b) of depositing a precursor substance is performed by inkjet printing, whereby the precursor substance is simultaneously deposited and patterned.

4. The method of claim 1, wherein the step b) of depositing a precursor substance is performed by printing, whereby the precursor substance is simultaneously deposited and patterned.

5. The method of claim 1, wherein the step b) of depositing a precursor substance is performed by an additive technique, whereby the precursor substance is simultaneously deposited and patterned.

6. The method of claim 5, wherein the additive technique is at least one technique selected from the list consisting of gravure printing, offset printing, microstamping, dip-pen printing, inkjet printing, and combinations thereof.

7. The method of claim 1, wherein the step b) of depositing a precursor substance is performed by inkjet printing, whereby the precursor substance is simultaneously deposited and patterned.

8. The method of claim 1, wherein the precursor substance comprises a sol gel.

9. The method of claim 8, wherein the precursor substance comprising a sol gel includes an oligomeric hydrocarbon.

10. The method of claim 8, wherein the precursor substance comprises an alkoxide of a transition metal.

11. The method of claim 1, wherein the precursor substance comprises an oligomeric hydrocarbon.

12. The method of claim 1, wherein the precursor substance comprises an alkoxide of a transition metal.

13. The method of claim 1, wherein the precursor substance comprises a phosphor.

14. The method of claim 1, wherein the precursor substance comprises a precursor for at least one of the oxides selected from the list consisting of zinc oxide, tin oxide, zinc tin oxide, titanium oxide, palladium oxide, indium oxide, gallium oxide, cadmium oxide, and combinations of these oxides.

15. The method of claim 1, wherein the step c) of enhancing carrier mobility of the semiconducting oxide film by irradiating the precursor substance is performed by irradiating with electromagnetic radiation having an effective wavelength of less than about 350 nanometers.

16. The method of claim 15, wherein the electromagnetic radiation having an effective wavelength of less than about 350 nanometers is selected from the list consisting of at least one of ultraviolet light, an electron beam, an ion beam, X-radiation, gamma radiation, and combinations thereof.

17. The method of claim 1, wherein the step c) of enhancing carrier mobility of the semiconducting oxide film by irradiating the precursor substance is performed by irradiating with electromagnetic radiation at a dose in the range from about 0.1 Joule/cm$^2$ to about 100 Joule/cm$^2$.

18. The method of claim 1, wherein the step c) of enhancing carrier mobility of the semiconducting oxide film by irradiating the precursor substance is performed by irradiating with ultraviolet radiation.

19. The method of claim 18, wherein the step c) of enhancing carrier mobility of the semiconducting oxide film by irradiating the precursor substance with ultraviolet radiation includes irradiating with radiation having at least one wavelength between about 157 nanometers and about 350 nanometers.

20. The method of claim 1, wherein the step c) of enhancing carrier mobility of the semiconducting oxide film by irradiating the precursor substance is performed while the precursor substance is laden with solvent.

21. The method of claim 1, further comprising heating the precursor substance while performing step c) of enhancing carrier mobility of the semiconducting oxide film by irradiating the precursor substance.

22. The method of claim 1, wherein the step d) of heating the nascent film is performed by heating at a predetermined temperature below about 550° C.

23. The method of claim 1, wherein the step d) of heating the nascent film is performed by heating at a predetermined temperature of about 350° C. or higher.

24. The method of claim 1, wherein the step d) of heating the nascent film is performed by heating at a predetermined temperature of about 550° C.

25. The method of claim 1, wherein the steps c) of enhancing carrier mobility of the semiconducting oxide film by irradiating the precursor substance and d) of heating the nascent film are performed simultaneously.

26. The method of claim 1, wherein the steps are performed in the order recited.

27. The method of claim 1, further comprising repeating steps a)-d) a number of times until a desired thickness of semiconducting oxide film is reached.

28. The method of claim 1, further comprising repeating steps a)-c) a number of times before performing step d) to form a desired thickness of semiconducting oxide film.

29. The method of claim 1, further comprising:
e) performing a pre-curing step at a temperature below the predetermined temperature before heating the nascent film at the predetermined temperature.

30. The method of claim 29, wherein the precursor substance includes a quantity of solvent and pre-curing step e) comprises heating the nascent film at a second temperature to remove at least a portion of the solvent, before heating the nascent film at the predetermined temperature.

31. The method of claim 29, wherein pre-curing step e) comprises exposing the precursor substance to electromagnetic radiation.

32. An inorganic semiconductive layer made by the method of claim 1.

33. A semiconducting oxide film layer made by the method of claim 1.

34. A method for making an inorganic semiconductive film, the method comprising the steps of:
a) providing a substrate;
b) inkjet printing upon the substrate a precursor substance comprising a sol gel including at least one metal, whereby the precursor substance is simultaneously deposited and patterned;
c) enhancing carrier mobility of the semiconducting oxide film by irradiating the precursor substance with electromagnetic radiation to form a nascent film; and d) heating the nascent film at a predetermined temperature to form an inorganic semiconductive film, whereby the combined effects of steps c) of enhancing by irradiating and d) of heating produce enhanced carrier mobility greater than 5.E-01 cm2/Volt-second and greater than carrier mobility obtained without irradiating the precursor substance.

35. The method of claim 34, wherein the steps are performed in the order recited.

36. An inorganic semiconductive layer made by the method of claim 34.

37. The method of claim 34, further comprising repeating steps a)-d) a number of times until a desired thickness of inorganic semiconductive film is reached.

38. The method of claim 34, further comprising repeating steps a)-c) a number of times until a first predetermined thickness is reached before performing step d) to form a desired second predetermined thickness of inorganic semiconductive film.

39. A method of using an inkjet printing system for forming a patterned inorganic semiconductive film on a substrate, the method comprising the acts of:

a) providing a precursor substance comprising a liquid including at least one metal, b) depositing the precursor substance in a desired pattern upon the substrate by inkjet printing, c) enhancing carrier mobility of the semiconducting oxide film by irradiating the precursor substance with electromagnetic radiation to form a nascent film, and d) heating the nascent film at a predetermined temperature to form a patterned inorganic semiconductive film, whereby the combined effects of steps c) of enhancing by irradiating and d) of heating produce enhanced carrier mobility greater than 5.E-01 cm2/Volt-second and greater than carrier mobility obtained without irradiating the precursor substance.

40. The method of claim 39, further comprising repeating steps a)-d) a number of times until a desired thickness of inorganic semiconductive film is reached.

41. The method of claim 39, further comprising repeating steps a)-c) a number of times until a first predetermined thickness is reached before performing step d) to form a desired second predetermined thickness of inorganic semiconductive film.

42. An inkjet printing method comprising the acts of:

a) providing a substrate, b) providing a printing medium comprising a precursor substance adapted to be converted to a semiconductive film having enhanced carrier mobility by irradiation with electromagnetic radiation and by heating, whereby the combined effects of irradiation and heating produce enhanced carrier mobility greater than 5.E-01 cm2/Volt-second and greater than carrier mobility obtained without irradiation of the precursor substance, c) inkjet printing the printing medium in a desired pattern on the substrate to form a patterned precursor, and d) converting the patterned precursor to a semiconductive film.

* * * * *